(12) United States Patent
Ezzeddine

(10) Patent No.: US 7,215,217 B2
(45) Date of Patent: May 8, 2007

(54) MARCHAND-TYPE DISTRIBUTED BALUN

(75) Inventor: Hilal Ezzeddine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/934,138

(22) Filed: Sep. 3, 2004

(65) Prior Publication Data

US 2005/0052257 A1   Mar. 10, 2005

(30) Foreign Application Priority Data

Sep. 4, 2003   (FR) .................................. 03 50503

(51) Int. Cl.
*H03H 7/42* (2006.01)
*H01F 5/00* (2006.01)

(52) U.S. Cl. .......................... 333/25; 333/26; 336/200

(58) Field of Classification Search .................. 333/25, 333/26; 336/200
See application file for complete search history.

(56) References Cited

U.S. PATENT DOCUMENTS 6,097,273 A * 8/2000 Frye et al. .................. 336/200
6,396,362 B1   5/2002 Mourant et al.
6,653,910 B2 * 11/2003 Escalera et al. .............. 333/26
2002/0113682 A1   8/2002 Gevorgian et al.
2003/0137383 A1   7/2003 Yang et al.
2003/0151881 A1   8/2003 Yue

OTHER PUBLICATIONS

French Search Report from French Patent Application 03/50503 filed Sep. 4, 2003.

* cited by examiner

*Primary Examiner*—Dean Takaoka
(74) *Attorney, Agent, or Firm*—Lisa K. Jorgenson; James H. Morris; Wolf, Greenfield & Sacks, P.C.

(57) ABSTRACT

A mode-switching transformer including a first conductive line between two common-mode access terminals and a second conductive line between two differential mode access terminals, the lines being coupled and sized according to a central operating frequency of the transformer, each line being formed of two stacked spirals in two different metallization levels and each spiral of a line being interdigited with a spiral of the other line.

12 Claims, 2 Drawing Sheets

MARCHAND-TYPE DISTRIBUTED BALUN

BACKGROUND OF THE INVENTION

1. Field of the Invention

The present invention relates to the field of mode-switching transformers which are used to convert a voltage from a common mode to a differential mode and conversely. Such transformers are generally called "balun" transformers, for "balanced-unbalanced".

2. Discussion of the Related Art

An example of application of a mode-switching transformer relates to radio frequency transceiver channels, for example, of a mobile phone. This type of application currently uses devices of balun type since, on the antenna side, it most often is a single-ended device.

Two main categories of mode-switching transformers are known, that is, coupled line baluns or distributed baluns, and baluns with local components. Baluns with coupled lines are formed of conductive tracks coupled to each other, the transformer's operating frequency being conditioned by the line length. Baluns with local components are formed of capacitive and inductive elements forming LC cells.

The present invention more specifically relates to baluns with coupled lines. Among these, the present invention more specifically relates to a Marchand-type balun, that is, a symmetrical balun having its coupled lines calculated in $\lambda/4$, where $\lambda$ represents the wavelength corresponding to the central frequency of the passband desired for the balun.

FIG. 1 very schematically shows the equivalent electric diagram of a conventional balun of Marchand type. Such a transformer is formed of four conductive sections each having a quarter wavelength coupled two by two. Two first sections 1 and 2 are in series between two differential mode accesses or terminals 5 and 6 and have their grounded midpoint 7 forming the reference on the differential side. The two other sections 3 and 4 are in series between a common-mode access port 8 and an access 9 generally open or left floating. Common mode terminal 8 is intended, for example, to be connected to an antenna. The corresponding signal is referenced, for example, to ground M of the equipment comprising the mode-switching transformer. Differential mode input-output terminals 5 and 6 are phase-shifted by 180° with respect to each other.

Distributed baluns are generally used for their wide-band character and for the fact that the differential access biasing is performed via midpoint 7 shown as being grounded.

FIG. 2 illustrates the practical implementation of a balun of the type illustrated schematically in FIG. 1, for example, on a glass substrate 10. Each section 1 to 4 is made in the form of a conductive track P1 to P4 wound to gain space with respect to a rectilinear line. The coupling between sections 1 and 3, respectively 2 and 4, is obtained by forming these sections on the same level or in different conductive levels. Tracks P1 and P2 are made in a first level and are formed of laterally spaced apart windings joining (connection P12) in the same level. Tracks P3 and P4 are made in a second level and are formed of laterally spaced apart windings respectively interdigited or superposed to windings P1 and P2. Tracks P3 and P4 are connected by a connection by vias and bridges P7 in a third level. Other vias are required to bring all terminals to a same level.

A mode-switching transformer essentially characterizes by four parameters measured by loading the different accesses with standardized 50-ohm impedances.

A first parameter relates to differential insertion losses corresponding to the path loss between the common-mode terminal and the two differential terminals. This parameter is generally considered as good if the losses are less than 1 dB.

A second parameter is the amplitude difference from on path to the other (amplitude imbalance), which corresponds to the difference between insertion losses from one path to the other. In an ideal transformer, that is, perfectly well balanced and with no insertion loss, the signal divides in two for the two differential ports and −3 dB are thus obtained on each path with respect to the common mode signal. The amplitude imbalance is then zero. The amplitude imbalance parameter is considered as good if it ranges between −0.5 dB and 0.5 dB.

A third parameter is the phase difference (phase imbalance) which measures the interval between the phase difference of two differential accesses with respect to the 180 degrees desired in the ideal case. The phase imbalance is considered to be good if it ranges between −5° and 5°.

A fourth parameter is the matching or return loss which corresponds to the impedance matching on the common mode and differential mode accesses. This last parameter is evaluated according to the circuits connected at each end of the transformer and is considered as acceptable if it is smaller than −15 dB.

All the above parameters are evaluated for different signal frequencies and are in fact given for an operating frequency range of the transformer around a central frequency.

A disadvantage of baluns with coupled lines is linked to the significant size required by the $\lambda/4$ lines which, in addition to a significant bulk, causes high insertion losses.

SUMMARY OF THE INVENTION

The present invention aims at providing a novel distributed-type balun structure which reduces the bulk of the transformer with respect to a conventional Marchand-type transformer, sized for the same frequency band.

The present invention also aims at keeping the symmetrical character of such a transformer and at avoiding for the size reduction to adversely affect its parameters.

To achieve these and other objects, the present invention provides a mode-switching transformer comprising a first conductive line between two common-mode access terminals and a second conductive line between two differential-mode access terminals, said lines being coupled and sized according to a central operating frequency of the transformer, each line being formed of two stacked spirals in two different metallization levels and each spiral of a line being interdigited with a spiral of the other line.

According to an embodiment of the present invention, a third metallization level is used to transfer outside of the structure a central contact of the winding.

According to an embodiment of the present invention, all points of access to the transformer are brought to a same metallization level, the number of vias being limited to five for the entire structure.

According to an embodiment of the present invention, the spirals are sized based on an inductance value desired for a non-stacked structure, knowing that the value increase is proportional to the square of the number of turns of the stacked structure.

The foregoing objects, features, and advantages of the present invention will be discussed in detail in the following non-limiting description of specific embodiments in connection with the accompanying drawings.

DETAILED DESCRIPTION

Figure 1:
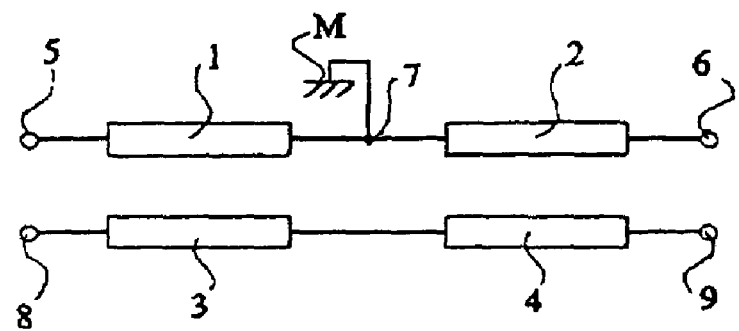
FIG. 1, previously described, shows a conventional example of a Marchand-type balun.

The same elements have been referred to with the same reference numerals in the different drawings. For clarity, only those elements which are necessary to the understanding of the present invention have been shown in the drawings and will be described hereafter. In particular, the application circuits connected upstream and downstream of a mode-switching transformer according to the present invention have not been described in detail, the present invention applying whatever exploitation is made of the transformer and being perfectly compatible with conventional uses of a transformer with coupled lines.

A feature of the present invention is to interlace or interdigit the windings constitutive of a mode-switching transformer in two metallization levels. In other words and in simplified fashion, the present invention provides folding on each other while interlacing them the two laterally spaced apart portions of the conventional structure of FIG. 2.

Contrary to all expectations, the present inventor has discovered that the fact of so stacking and interlacing the windings is compatible with the balun operation. Up to now, the search for a symmetrical structure to maintain the differential character of the balun let believe that such a stacking was not possible. Further, the need for a connection at the middle of the differential mode winding let believe in the need for a via in the very winding, which would have considerably increased the structure size.

Regarding these prejudices, the present invention enables placing the via necessary to the midpoint connection at the center of the winding, which does not require spacing apart the conductive lines with respect to one another along the very winding. Further, due to the pattern given to the conductive tracks and the fact that they are interdigited two by two, the four sections can be formed in three metallization levels only, including the interconnection.

Figure 3A:
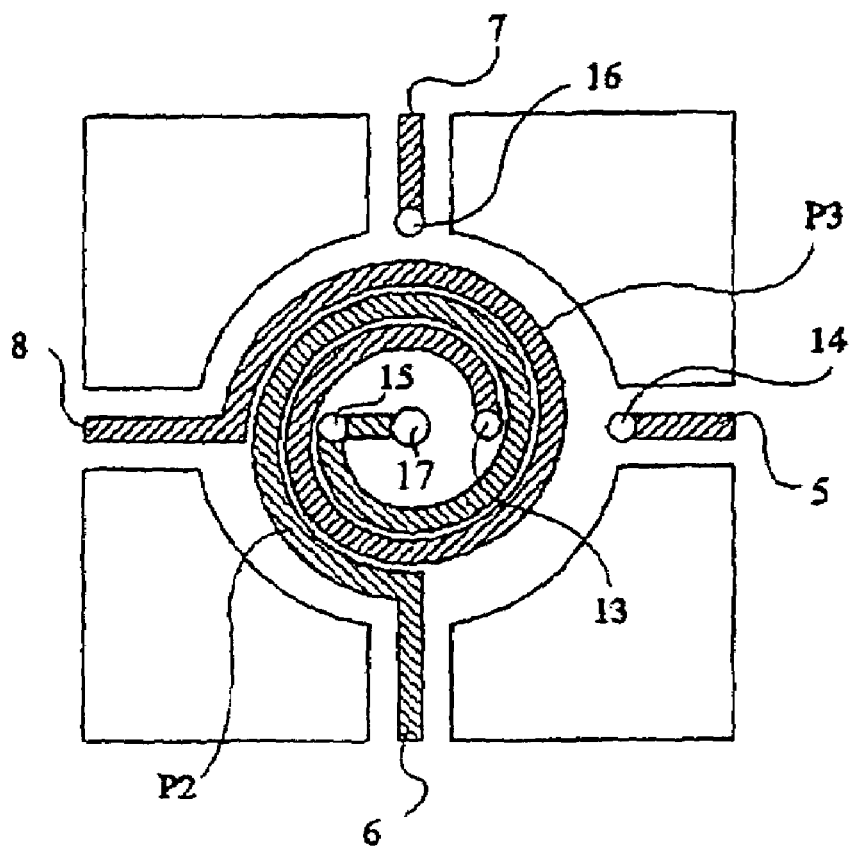
FIGS. 3A to 3C are top views of a mode-switching transformer according to an embodiment of the present invention.
Figure 3B:
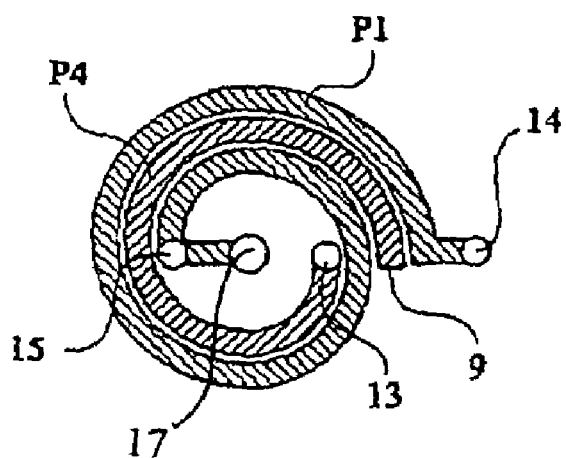
Figure 3C:
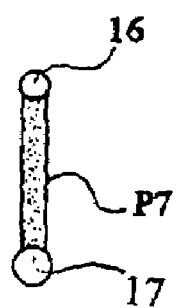

FIGS. 3A to 3C show top views of an embodiment of a balun according to the present invention. To make the discussion clearer, these drawings illustrate the conductive patterns in the three levels A, B, C of the structure. For clarity still, the number of spirals of the windings has been limited to one.

Figure 2:
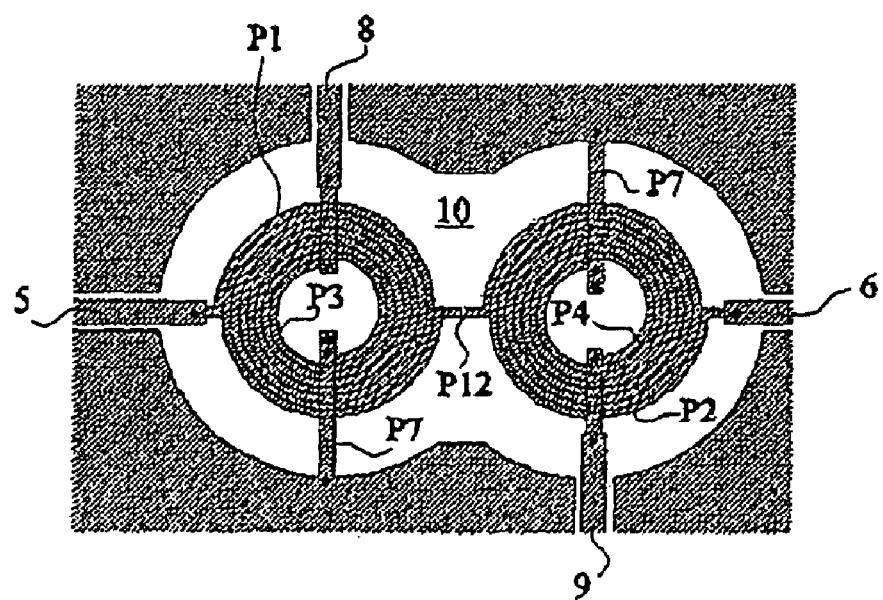
FIG. 2, previously described, illustrates a practical embodiment of the Marchand-type balun of FIG. 1.

These drawings should be compared with the representation of FIG. 2 with respect to which it can be seen that all the conductive lines of the present invention are in a single circular bulk. However, although the forming of circular windings is a preferred embodiment (especially to avoid edge effects), the present invention is perfectly compatible with windings exhibiting different shapes (especially polygonal).

An advantage of stacking up the spirals as provided by the present invention is that advantage is then taken of the coupling between two stacked spirals which increase the inductance value. The stacking enables squaring up the inductance value with respect to a same winding in a single level. To obtain a positive mutual inductance and take advantage of this effect, it is necessary for the current flow in the winding to be performed in the same direction in both levels. To preserve the symmetry and thus the balun character of the structure, the same number of spirals is provided in the two metallization levels forming a winding.

The transformer's primary, defined as being the common mode line, that is, that between common-mode access 8 and floating terminal 9 is formed in two metallization levels A and B. A first section P3 of the winding is formed, for example, in level A by turning clockwise from terminal 8 (for example placed west in the orientation of the drawing). In the middle of this winding, a via 13 runs over metallization level B and the winding continues in the same direction, but this time outwards, thus forming its second section P4 which, in this example, ends with an open port 9 in the same level B, to the east. The case of a balun where the end of the common mode line, opposite to access 8, remains floating is considered. In the shown structure, this provides four connection terminals (connection 7 included) at the four cardinal points.

On the secondary or differential mode line side (between terminals 5 and 6), the forming of first section P1 to be coupled with first section P3 of the first line in level B is provided. The winding is then placed in interlaced (interdigited) fashion with section P4 by starting from a via 14, to the east, (to recover terminal 5 in the first level) to reach its middle by turning counterclockwise. A via 15 then runs into level A to continue the winding by section P2 up to terminal 6, to the south, always turning counterclockwise. The connection of the midpoint to terminal 7 (north) in level A is ensured by a bridge P7 in third level C connecting an external via 16 between levels A and C to a central via 17 connecting levels A, B, and C, sections P1 and P2 being connected to this via 17 in levels B and A.

It can thus be seen that the structure provided by the present invention requires three metallization levels, five vias, and one bridge to form the entire transformer. This should be compared with the four bridges, ten vias, and three metallization levels required in the case of a conventional balun (FIG. 2).

Although the fact of interlacing the windings requires a sligthly larger spacing between conductive lines (due to technological limitations), the fact for these windings to be shorter due to the mutual inductance between each of these sections, results in a smaller general bulk of the balun of the present invention.

As an alternative, terminations of the sections at locations other than at the cardinal points may be provided, provided that this is compatible with the maintaining of the balun's symmetrical character. The larger the number of spirals, the greater the length difference of the last turn between two sections of a same line can be (for example, one quarter, or even half of a turn).

The equivalent electric diagram is the same as that of a conventional balun (FIG. 1), except that the lines are now no longer in $\lambda/4$ with respect to the central balun frequency. Indeed, the additional coupling enables, for a constant inductance value, decreasing the length.

As a specific example of implementation, a mode-switching transformer made according to the structure of FIG. 2 for a 1-GHz central frequency requires, with tracks of same length, a same spacing between tracks and a same internal radius of the spirals, 7 turns and a half for each of the windings against 4 turns and a half only in the structure of the present invention (FIG. 3), the length required to preserve the inductance values decreasing from 25 mm in the conventional case to 9 mm according to the present invention.

The present invention enables dividing at least by two the size necessary to form the mode-switching transformer.

The reduction in the winding length comes along with a reduction in insertion losses without adversely affecting the other balun parameters.

To size a balun according to the present invention, it is started from the central frequency desired for the balun passband. Central frequency f enables determining the required wavelength by applying the following formula $$\lambda = \frac{c}{f\sqrt{\varepsilon}},$$

where c represents the speed of light in vacuum and $\varepsilon$ represents the permittivity of the substrate in which the structure is formed. The track length is, in the conventional case, calculated to correspond to $\lambda/4$ and results in an inductance value L depending on this length, on the number of spirals, on the track width, and on the spacing thereof.

According to the present invention, inductance value L is desired to be maintained with respect to a conventional sizing. This results in reducing the necessary length since the winding stacking enables, for a given conductive track length, approximately squaring up the inductance value with respect to a winding formed in a single level.

Of course, the present invention is likely to have various alterations, modifications, and improvements which will readily occur to those skilled in the art. In particular, the dimensions to be given to the conductive lines will be determined, as in a conventional transformer, by using simulation tools enabling optimizing the different parameters.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mode-switching transformer comprising a first conductive line between two common-mode access terminals and a second conductive line between two differential-mode access terminals, said lines being coupled and sized according to a central operating frequency of the transformer, wherein each line is formed of two stacked spirals in two different metallization levels, each spiral of a line being interdigited with a spiral of the other line;
    wherein a third metallization level is used to connect outside of the structure a central contact of a winding of one of the conductive lines.

2. A mode-switching transformer comprising a first conductive line between two common-mode access terminals and a second conductive line between two differential-mode access terminals, said lines being coupled and sized according to a central operating frequency of the transformer, wherein each line is formed of two stacked spirals in two different metallization levels, each spiral of a line being interdigited with a spiral of the other line;
    wherein a third metallization level is used to connect outside of the structure a central contact of the winding, and
    wherein all points of access to the transformer are formed in a same metallization level, the number of vias being limited to no more than five for the entire structure.

3. The transformer of claim 1, wherein the spirals are sized based on an inductance value desired for a non-stacked structure, knowing that the value increase is proportional to the square of the number of turns of the stacked structure.

4. The transformer of claim 2, wherein the spirals are sized based on an inductance value desired for a non-stacked structure, knowing that the value increase is proportional to the square of the number of turns of the stacked structure.

5. A mode-switching transformer comprising:
    two common-mode access terminals;
    a first conductive line connecting the two common-mode access terminals;
    two differential-mode access terminals;
    a second conductive line connecting the two differential-mode access terminals, the first and second conductive lines being coupled to one another;
    the first conductive line having a first stacked spiral in a first metallization layer and a second stacked spiral in a second, different metallization layer;
    the second conductive line having a third stacked spiral in the second metallization layer, the third stacked spiral being interdigited with the second stacked spiral;
    the second conductive line having a fourth stacked spiral in the first metallization layer, the fourth stacked spiral being interdigited with the first stacked spiral; and
    a central contact disposed in a center of a stacked spiral of one of the first and second conductive lines, the central contact being configured to be connected to a component outside of the transformer, and the central contact being formed in a third metallization level that is different from the first and second metallization levels.

6. The transformer of claim 5, wherein the central contact comprises a central contact of the first conductive line.

7. The transformer of claim 5, wherein the central contact comprises a central contact of the second conductive line.

8. The transformer of claim 5, wherein all points of access to the transformer are in the third metallization level.

9. The transformer of claim 5, wherein the transformer comprises no more than five vias.

10. The transformer of claim 8, wherein the transformer comprises no more that five vias.

11. The transformer of claim 8, wherein the transformer comprises exactly five vias.

12. The transformer of claim 5, wherein the first and second conductive lines have lengths that are sized to provide a central frequency of a desired passband for the transformer.

* * * * *